United States Patent [19]
Ohara et al.

[11] Patent Number: 5,153,700
[45] Date of Patent: Oct. 6, 1992

[54] CRYSTAL-ETCHED MATCHING FACES ON SEMICONDUCTOR CHIP AND SUPPORTING SEMICONDUCTOR SUBSTRATE

[75] Inventors: Fumio Ohara, Nukata; Toshiyuki Kawai, Toyohashi; Nobuyoshi Sakakibara, Nishio; Seizi Huzino, Anjo; Tadashi Hattori, Okazaki; Kazunori Kawamoto, Anjo, all of Japan

[73] Assignees: Nippondenso Co., Ltd., Kariya; Nippon Soken Inc., Nishio, both of Japan

[21] Appl. No.: 643,585

[22] Filed: Jan. 22, 1991

[30] Foreign Application Priority Data

Jul. 22, 1988 [JP] Japan .................................. 63-184191

[51] Int. Cl.[5] .......................................... H01L 27/04
[52] U.S. Cl. ....................................... 357/49; 357/55; 357/60; 357/75
[58] Field of Search ....................... 357/60, 55, 49, 74, 357/75

[56] References Cited

U.S. PATENT DOCUMENTS

| | | | |
|---|---|---|---|
| 3,871,015 | 3/1975 | Lin et al. | 357/67 |
| 4,190,855 | 2/1980 | Inoue | 357/80 |
| 4,670,770 | 6/1987 | Tai | 357/60 |

FOREIGN PATENT DOCUMENTS

| | | |
|---|---|---|
| 57-56216 | 11/1982 | Japan . |
| 58-53847 | 3/1983 | Japan . |
| 62-147746 | 7/1987 | Japan . |
| 62-291037 | 12/1987 | Japan . |
| 63-156328 | 6/1988 | Japan . |

OTHER PUBLICATIONS

IEEE Journal of Solid State Circuits, vol. SC 21, No. 5, Oct. 1986, pp. 845-851.

Primary Examiner—William D. Larkins
Attorney, Agent, or Firm—Cushman, Darby & Cushman

[57] ABSTRACT

Semiconductor chips are mounted in a supporting semiconductor substrate, with matching anisotropic (crystal plane) faces on the chips and substrate. The chips may extend above the substrate to facilitate connection together.

3 Claims, 8 Drawing Sheets

CRYSTAL-ETCHED MATCHING FACES ON SEMICONDUCTOR CHIP AND SUPPORTING SEMICONDUCTOR SUBSTRATE

CROSS-REFERENCES TO THE RELATED APPLICATIONS

This application is a continuation-in-part of PCT application No. PCT/JP89/00730 filed on Jul. 21, 1989, now abandoned.

FIELD OF THE INVENTION

The present invention relates to a semiconductor device which is, for instance, highly integrated and has the advantage of improved reliability.

BACKGROUND OF THE INVENTION

According to conventional microminiaturization of the wiring pattern in hybrid integrated circuits, such microminiaturization has the following advantages:
1. High-density integration of circuits
2. High-speed operation of circuits by shortening the length of circuits
3. Improvement in reliability by reducing the number of contact elements It is known that there is a flip-chip type hybrid integrated circuit in which a solder bump is formed on a wiring pad of a semiconductor chip or on a substrate on which the wiring is formed, so that the semiconductor chip is coupled to and therefore contacted with the substrate by the bump. However, according to this flip-chip type, since the adhesive area became the bump area and required a large area, the wiring pitch was between 150 and 200 microns for improving the adhesive strength, and the microminiaturization of the wiring pitch was difficult. On the other hand, a buried type hybrid integrated circuit has been proposed. According to the buried type, after a semiconductor chip is buried by epoxy resin in a hole formed on a substrate, contact wiring is formed. However, since the position of the buried semiconductor chip is not accurate, the microminiaturization of the wiring pitch is difficult in the process of forming the contact wiring.

SUMMARY OF THE INVENTION

Therefore, an object of the present invention is to easily improve the accuracy of the position of the semiconductor chip, to reduce the wiring pitch to the large extent and to prevent the wiring from being disconnected by a gap.

For the purpose of achieving the above-described object, a semiconductor device of the present invention is characterized by the following elements; namely: a substrate made of silicon having a predetermined face-orientation and on which is a coupling hole a tapered portion formed by an anisotropic etching so that the coupling hole goes through the substrate from its main side surface to its opposite side surface and so that an opening size of the backside surface is larger than that of the main side surface;

a semiconductor chip made of silicon having the same face orientation as the substrate, on which a taper portion having an equivalent face to the taper portion of the coupling hole is formed by anisotropic etching so that such face is exposed to the coupling hole extending from the main side surface through the opposite side surface and that its size of the main side surface is smaller than the opening size of the main side surface of the coupling hole, an element being formed on the semiconductor chip;

a coupling member for coupling the substrate to the semiconductor chip so that the taper portion of the coupling hole corresponds to the taper portion of the semiconductor chip;

a leveling layer formed across the substrate and the semiconductor chip; and wiring electrically connected to the element, at least a part thereof being formed on the leveling layer.

By using the above structure, the accuracy of the chip in a horizontal direction can be easily improved because the tapered portion of the semiconductor chip is coupled to the tapered portion of the coupling hole and rub each other in the process for burying the semiconductor chip into the coupling hole. Such improvement can result in the reduction of the cost for controlling the position accuracy to a large extent and also reduces the wiring pitch extremely. In addition to this, the taper angle of the semiconductor chip can easily and accurately correspond to the taper angle of the substrate. Since the tapered portion of the semiconductor chip is parallel to that of the coupling hole in the process for burying the semiconductor chip into the coupling hole, the semiconductor chip is hardly shifted to a wrong position, and therefore, accuracy of its position and productivity can be improved.

In this case, the coupling-hole may have first and second taper portions. The first tapered portion may be formed on the main side surface of the substrate so that the opening area of the main surface of the substrate is larger than the area of the inside portion of the substrate. On the other hand, the second tapered portion may be formed on the opposite side of the main surface of the substrate so that the opening area of the opposite side is larger than the area of the inside portion of the substrate. Otherwise, the main side surface of the semiconductor chip may be struck up from the surface of the main side surface of the substrate. According to this structure, even if a gap between the main surface of the substrate and the surface of the semiconductor chip occurs, adverse influence of such gap can be reduced, and therefore disconnection of the wiring can be prevented.

DETAILED DESCRIPTION OF THE PREFERRED EMBODIMENTS

Figure 1:
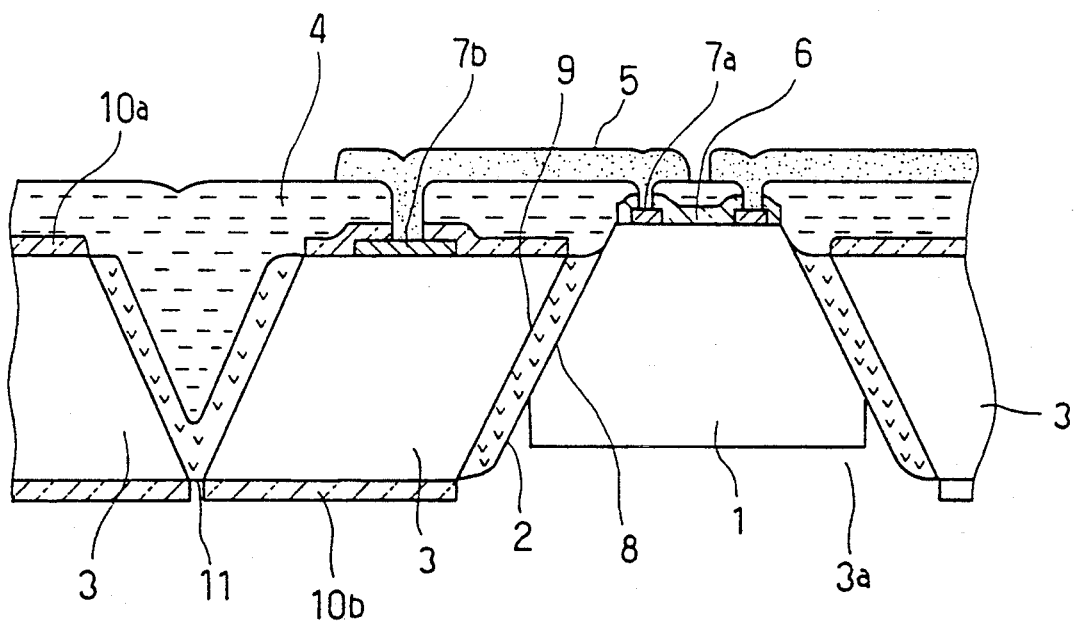
FIG. 1 is a sectional view of a hybrid integrated circuit device according to a first embodiment of the present invention.

The present invention is explained in detail below by using the embodiments shown in the drawings.

FIG. 1 shows a sectional view of a hybrid integrated circuit device according to FIG. 1 of the present invention and FIGS. 2(a) to (j) show sectional views illustrating its production process. In FIG. 1, reference numeral 1 shows a semiconductor chip which is comprised of a silicon substrate having a face-orientation (100). A taper portion 8 is formed by anisotropic etching on the upper end face extending from its main side surface toward to its opposite-side surface. Reference numeral 2 shows an adhesive member (e.g. low-boiling point glass, resin such as polyimido and epoxy, and eutectic). Reference numeral 3 shows a silicon substrate having a face-orientation of (100). A chip-coupling hole 3a is formed on the opposite side of the substrate by anisotropic etching so that its size is the same as that of the semiconductor chip 1.

If there is unevenness of $\pm \Delta t$ in the thickness of the substrate ($\pm \Delta t$ is approximately 15 $\mu$), the surface of the semiconductor chip 1 does not correspond exactly to that of the substrate 3. Since it is difficult to connect the semiconductor chip 1 to the substrate 3 by film wiring in such a case, or if the surface of the semiconductor chip 1 does not protrude upwardly from the surface of the substrate 3, it is necessary to take a measure so that the surface of the semiconductor chip 1 is no lower than that of the substrate 3.

In this embodiment, the device should be designed so that the surface of the semiconductor chip 1 corresponds to that of the substrate 3 when the thickness of the substrate 3 is the maximum (when the dispersion is $+\Delta t$). So the maximum gap which might occur between the semiconductor chip 1 and the substrate 3 would be $2\Delta t$. Accordingly, for the purpose of making the semiconductor chip 1 stick up from the surface of the substrate 3, it is necessary to design it beforehand so as to make the surface of the semiconductor chip 1 stick up by $2\Delta t$. The leveling layer 4 is formed across the semiconductor chip 1 and the substrate 3 so as to level the gap which has occurred. Polyimido resin or SOG(spin on glass) is applied to the material of the leveling layer 4.

Reference numeral 5 is wiring made of aluminum electrically connected to the semiconductor chip 1. Reference numeral 6 shows a passivation film of the semiconductor chip 1. Reference numeral 7a shows an electrode which is made of aluminum for instance and formed on the surface of the semiconductor chip 1. Reference numeral 7b shows an electrode which is formed on the surface of the substrate 3. Reference numerals 8 and 9 show taper portions which are formed by anistropic etching. Reference numeral 10a and 10b show a passivation film of the substrate 3. Reference numeral 11 shows a position-indication-hole for indicating the relationship between the main surface of the substrate 3 and the opposite side of the substrate 3. The semiconductor chip 1 and the substrate 3 include other elements such as transistors and resistances which are not illustrated in the drawings and electrically connected to the electrodes 7a and 7b, and wiring 5.

The production process of the hybrid integrated circuit shown in FIG. 1 is explained in detail below with reference to FIGS. 2(a)–(j).

Figure 2A:
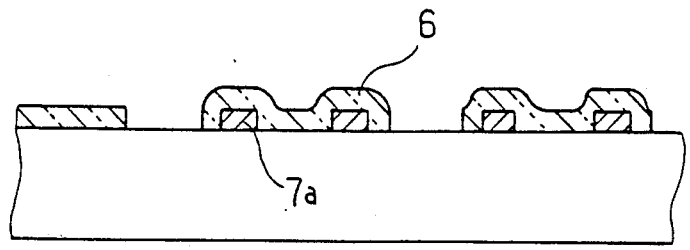
FIG. 2 (a) to (j) are sectional views showing a production process of the first embodiment.
Figure 2B:
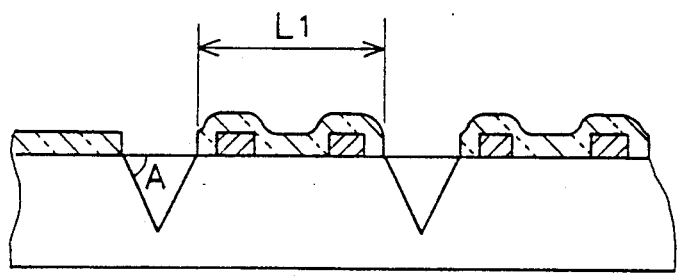
Figure 2C:
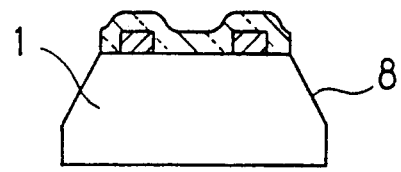

First of all, electrode 7a is formed on the semiconductor chip 1 after the elements such as transistors and resistances have been formed on the semiconductor chip 1 by conventional process such as impurity doping. Then, the passivation film 6 of nitride silicon is formed on the semiconductor chip 1 as shown in FIG. 2(a). Then, as shown in FIG. 2(b), a V shape ditch is formed by anisotropic etching which uses the partially opened passivation film 6 as a mask. The angle "A" of the V shape ditch is approximately 54.7°. Since the surface of the V shape ditch becomes a contacting surface, it is necessary to form it deeply in order to improve the coupling strength. The semiconductor chip 1 is cut along the V shape ditch as shown in FIG. 2(c) to obtain a unit chip.

Figure 2D:
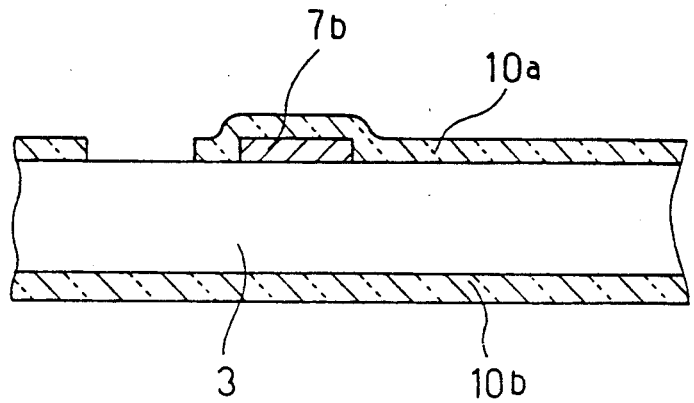
Figure 2E:
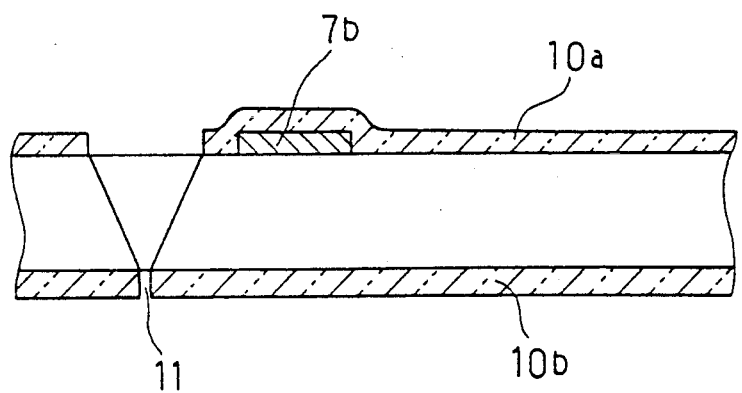

On the other hand, both sides of the substrate 3 are covered with passivation films 10a and 10b as shown in FIG. 2(d) after the electrode 7b has been formed on the substrate 3. Then, the position indication hole 11 is formed as shown in FIG. 2(e) by anisotropic etching which uses the partially opened passivation film 10a as a mask. The difference between the position of the electrode 7b and the opposite-side of the substrate 3 is clarified by the presence of the position-indication-hole 11.

Figure 2F:
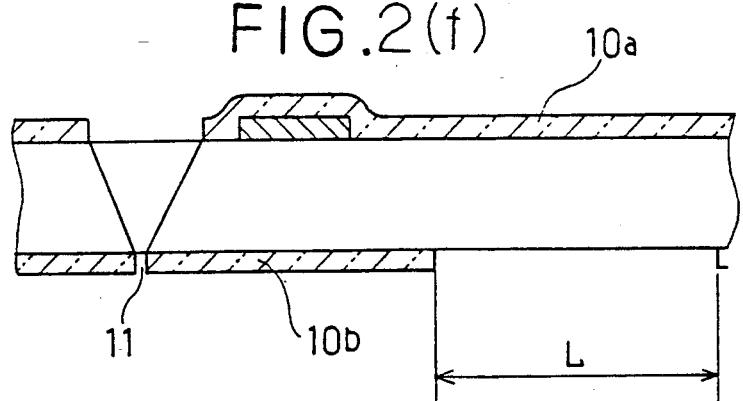
Figure 2G:
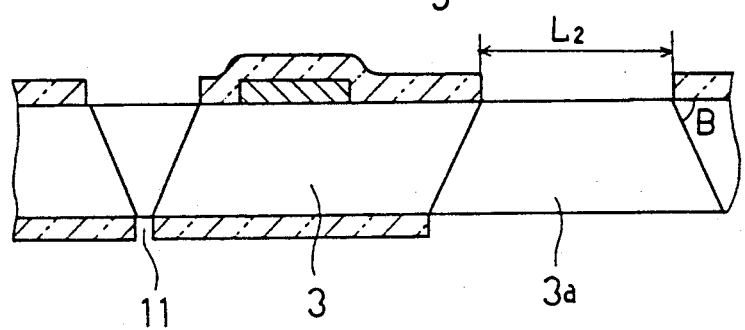

In the next process, the passivation film 10b is etched with reference to the position of the position-indication hole 11 as shown in FIG. 2(f). Then, the chip-coupling hole 3a is formed by anisotropic etching which uses the partially opened passivation film 10b as a mask as shown in FIG. 2(g), so that the chip-coupling hole 3a goes through from the main side surface to the opposite side surface and so that the opening size of the backside surface is larger than the opening size of the main side surface. The angle "B" between the tapered portion and the main side surface of the substrate 3 is set at about 54.7°. In this process, the length "L" is determined so that the surface length "L1" of the semiconductor chip 1 corresponds to the surface length "L2" of the chip-coupling hole 3a.

Figure 2H:
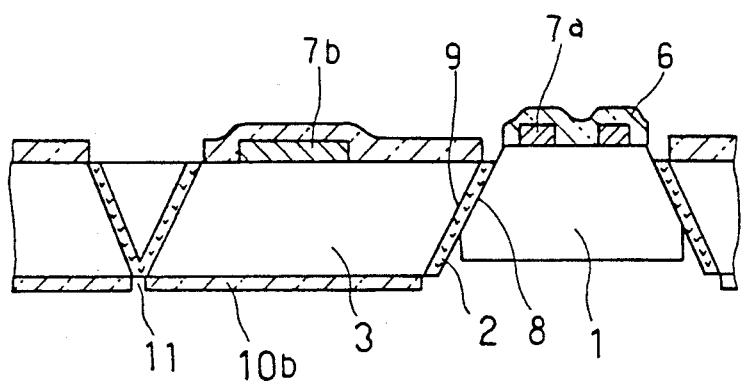
Figure 2I:
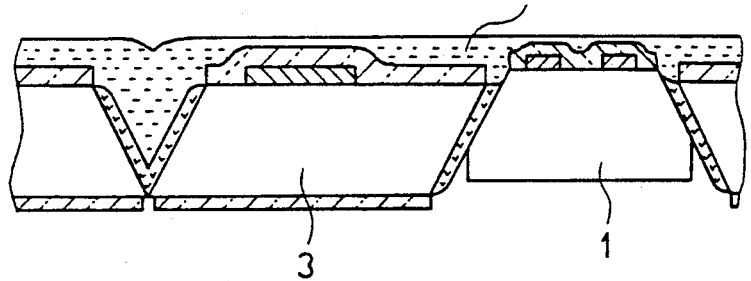

The above processed semiconductor chip 1 is coupled to the above processed substrate 3 through the adhesive member 2 as shown in FIG. 2(h). As shown in the drawing, the size of the main side surface of the semiconductor chip 1 is smaller than the opening size of the main side surface of the chip-coupling hole. In this process, the adhesive member 2 has to be treated with heat which has no adverse influence of the elements (e.g. below 500° C. in case aluminum wiring is used in the elements). In addition to this requirement, the adhesive member 2 has to withstand the heat-treatment in the next step of forming the leveling layer 4 shown in FIG. 2(i).

In the step for forming the leveling layer 4, a polyimido resin is used as the leveling layer 4 and treated with the maximum temperature 350° C.

For the reason, a low-boiling point glass or polyimido resin is used in the adhesive member 2.

Figure 2J:
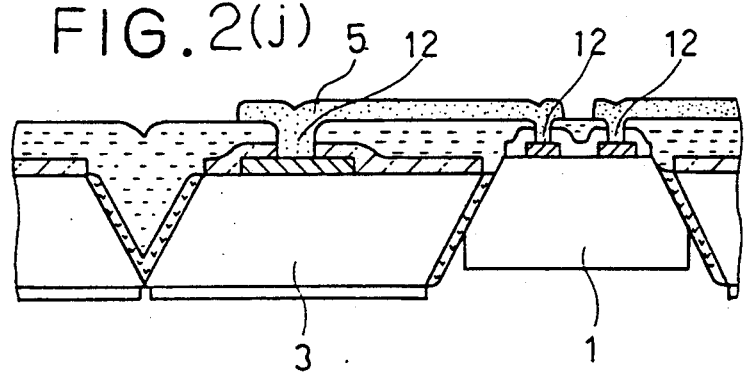

After the above-leveling step, a contact hole 12 is formed by $O_2$ plasma etching for instance as shown in FIG. 2(j). Then, aluminum film is formed by vapor deposition or spattering. This aluminum film is etched in a pattern that forms the wiring 5 which connects the electrode 7a on the semiconductor chip 1 to the electrode 7b on the substrate 3. Even if the above-described leveling is insufficient, disconnection of the wiring 5 can be prevented because the gap portion has a taper angle of 125° and the chip surface protrudes upwardly from the surface of the substrate 3.

In case that other elements are formed on the substrate 3 beforehand, a further high-density integration can be obtained. For example, in case that the present embodiment is applied to an LSI device which is used in a fuzzy logic, its CPU may be formed on the substrate 3 and its memory such as EEPROM may be formed on the semiconductor chip 1. When such a memory and CPU are integrated into one chip, additional masks are required. However, if such elements are formed on the substrate 3 and the semiconductor chip 1, respectively, the number of the masks can be reduced.

According to the present embodiment, the semiconductor chip 1 and the substrate 3 have taper portions 8 and 9, respectively, and they are coupled to each other so that each taper portion corresponds to each other. So the accuracy of the chip position in the horizontal direction can be improved since the tapered portion 8 is coupled to the tapered portion 9 through the adhesive member 2 with a rubbing movement. Both taper portions 8 and 9 are accurately formed by anisotropic etching. In the etching process of the silicon having the face orientation (100), since the etching mask has an square opening, its etching proceeds with exposing an equivalent face along the square opening. As a result, all taper angles of the tapered portions are the same angle (54.7°) and taper portion 8 becomes parallel to the taper portion 9.

Since the accuracy of the positions of the semiconductor chip 1 and the substrate 3 is improved, an incorrect shift between electrodes 7a, 7b and the wiring 5 does not occur, and therefore the wiring pitch can be significantly reduced.

Figure 3:
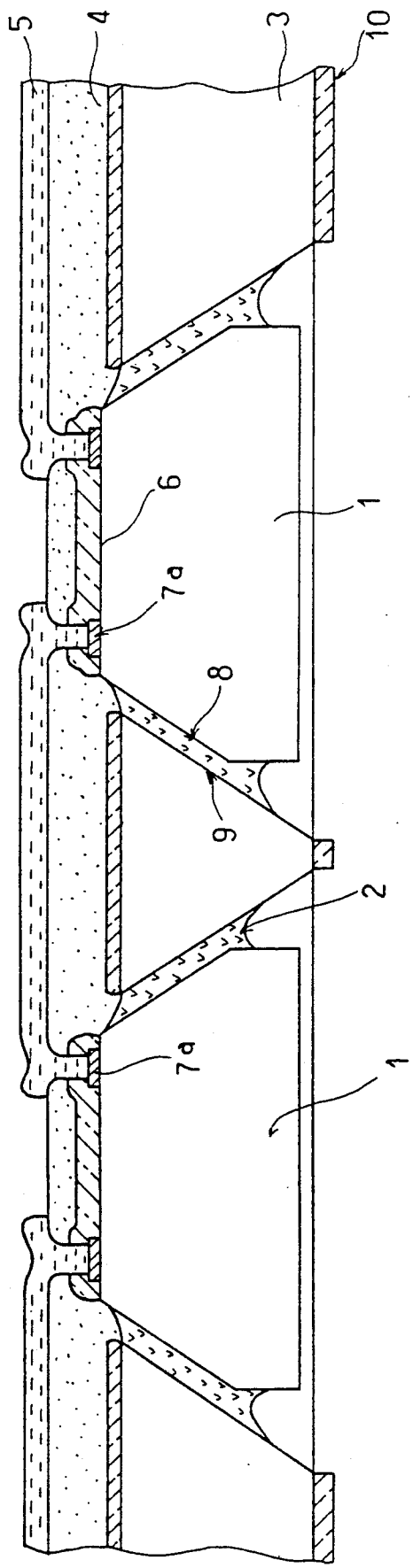
FIG. 3 is a sectional view of a second embodiment of the present invention.

A second embodiment of the present invention is explained with reference to FIG. 3. Most of the structures of the second embodiment are the same as those of the first embodiment. However, according to the second embodiment, a plurality of semiconductor chips 1 are connected to one another by the wiring 5 while in the first embodiment the semiconductor chip 1 is connected to the substrate 3 by wiring. With regard to the other structure in the second embodiment, the reference numerals identical to those of the first embodiment denote the same elements as those of the first embodiment. It is obvious that such elements have the same effect as those in the first embodiment.

Figure 4:
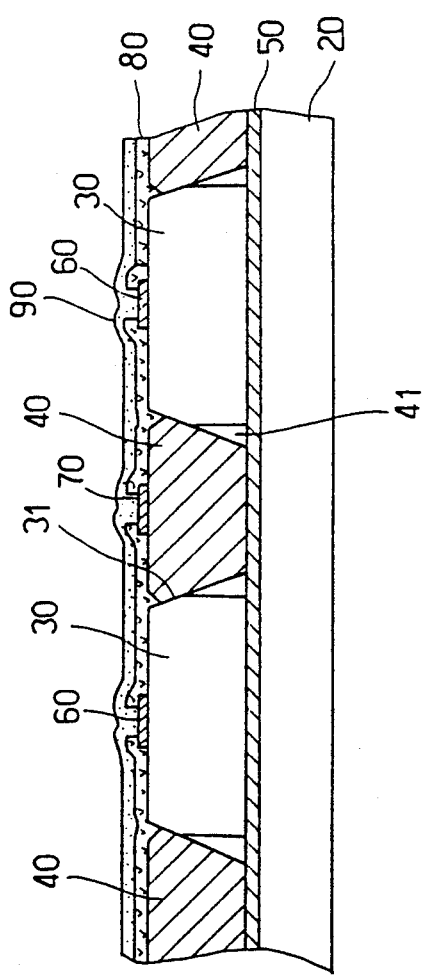
FIG. 4 is a sectional view of a third embodiment of the present invention.
Figure 5:
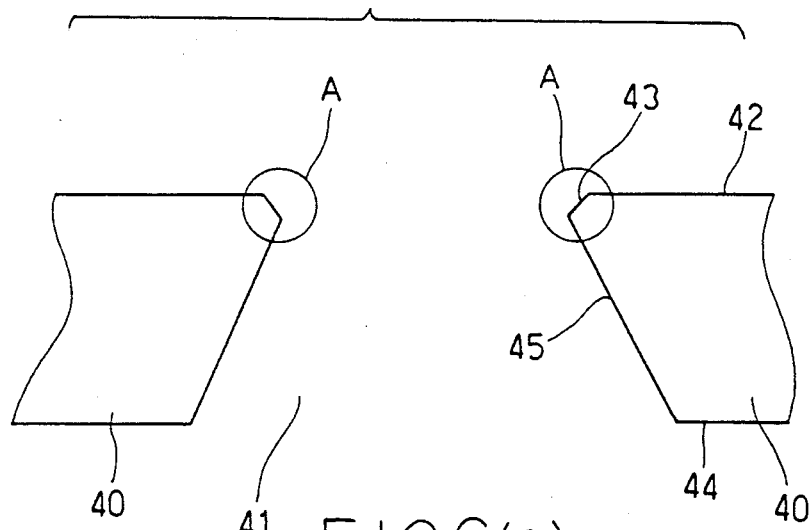
FIG. 5 is a schematic view of said third embodiment of the present invention.
Figure 6A:
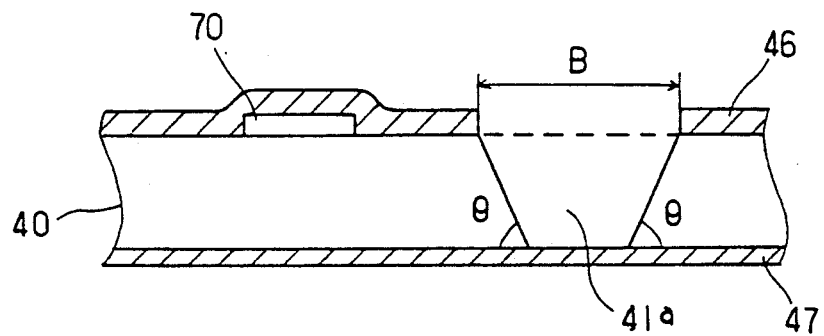
FIG. 6 (a) and (b) are schematic views showing a production process of the substrate.

A third embodiment of the present invention is explained with reference to FIGS. 4 through 8. The third embodiment is made for effectively reducing the maximum gap between the semiconductor chip 1 and the substrate 3, which occurs from the random thickness of the substrate 3. Accordingly, such reduction is preferable to the later process such as the leveling process and prevents the wiring from disconnection. FIG. 4 illustrates the basic structure of the present invention. FIG. 5 illustrates a characteristic portion of the present embodiment, namely the sectional view of a hole formed in a wiring substrate 40. FIGS. 6(a) and (b) show a process of manufacturing the hole shown in FIG. 5.

In FIG. 4, a substrate 20 is a flat board such as silicon wafer, ceramic board, metal board or glass board. Reference numeral 30 designates a semiconductor chip made of silicon having the face-orientation (100). A taper portion 3 is formed on the upper part of the semiconductor chip 30 by anisotropic etching (alkali solvent). Reference numeral 40 denotes a silicon substrate which has the face-orientation (100). This silicon substrate 40 is used for forming wiring. Reference numeral 50 denotes an adhesive member for coupling the semiconductor chip with the substrate 40 (e.g., low-boiling-point glass or polyimido resin etc.) Reference numeral 41 denotes a coupling hole, which is formed by anisotropic etching. The coupling hole 41 has a first tapered portion 43 formed on a main surface 42 as indicated by a circle A in FIG. 5 and a second taper portion 45 formed in the substrate 40. So the opening area of the inside of the coupling hole 41 is smaller than that on the main side surface of the substrate 40, and the opening area of the inside of the coupling hole 41 is smaller than that on the opposite side 44 of the substrate 40. In FIG. 4, reference numerals 60 and 70 designate electrodes and 80 and 90 designate a leveling layer and wiring, respectively.

Figure 7A:
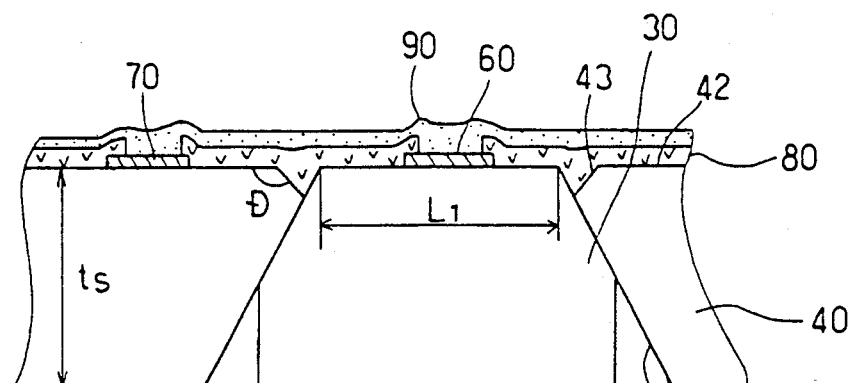
FIG. 7 is a schematic view showing an effect of the third embodiment.
Figure 7B:
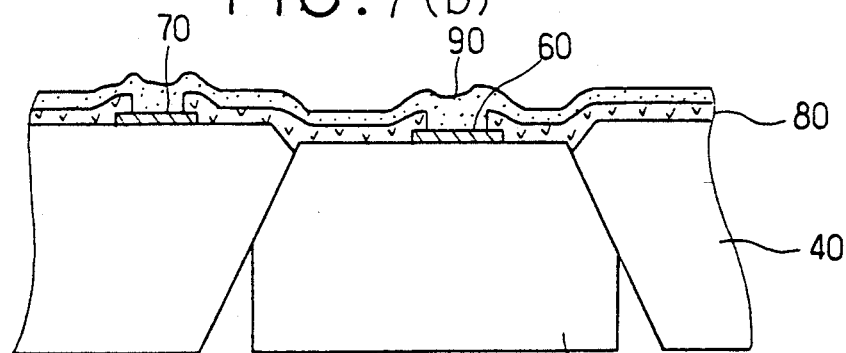

The length of "B" and "C" shown in FIGS. 7(a) and 7(b) may be estimated by the following expression:

$$B = L_1 + 2\Delta t / \tan\Theta \quad (1)$$

$$C = L_1 + 2ts \cdot \tan(90° - \Theta) \quad (2)$$

In the above expression, $L_1$, ts, and $\pm\Delta t$ designate the length of the upper-plain portion of the semiconductor chip 30, a thickness of the substrate 40 and an unevenness, respectively. Designation $\Theta$ indicates an angle (54.7° to silicon 100) of a taper which is formed in an anisotropic etching.

Figure 6B:
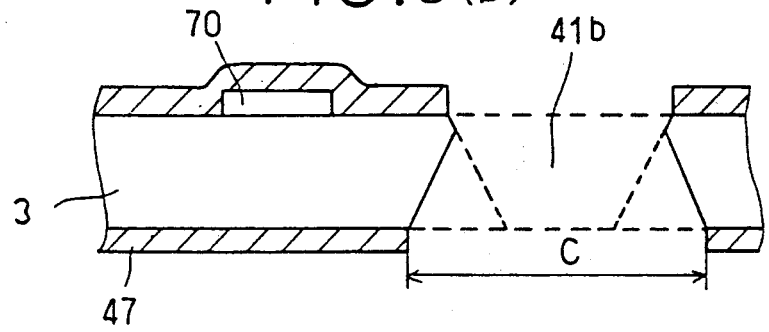

In the step shown in FIG. 6(a), etching mask film 46 and 47 made of $SiO_2$ or $Si_3N_4$ are formed on opposite sides of the substrate 40 so as to form a tapered hole 41a in length B. Then, as shown in FIG. 6(b), the etching mask film 40 on the opposite side of the substrate 40 has a tapered hole 41b etched in the length C by anisotropic etching. In this process, both etching mask film 46 and 47 may be etched by anisotropic etching at the same time.

Figure 7C:
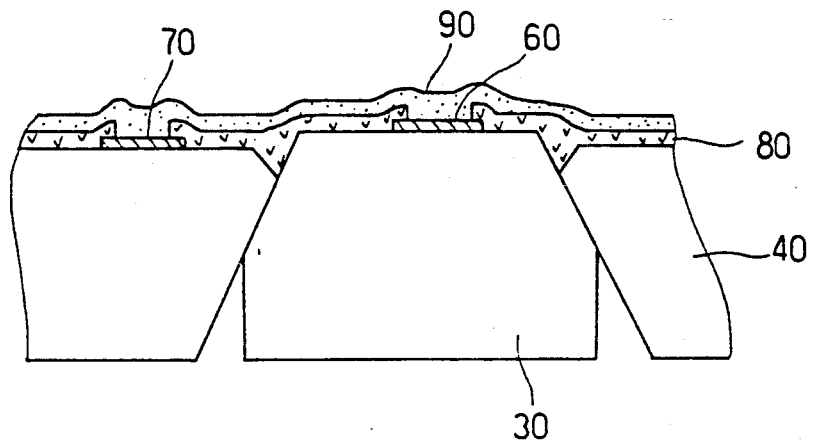

By using the above described structure in the tapered hole 41b, the later process shown in FIGS. 7(a)-(c) can be obtained irrespective of the thickness of the semiconductor chip 30. FIG. 7(a), FIG. 7(b) and FIG. 7(c) show a case in which the thickness of the semiconductor chip 30 equals that of the substrate 40, a case in which the semiconductor chip 30 is thinner than that of the substrate 50, and a case that the semiconductor chip 30 is thicker than that of the substrate 50, respectively. The gap which occurs at a coupling portion when the tapered portion of the semiconductor chip 30 is coupled to the tapered hole of the substrate 40 may be absorbed by the adhesive member 50 using other material such as resin (i.e., an adhesive which is hardened by a heat treatment). According to the present embodiment, an angle "D" formed between the main surface 42 of the substrate 40 and the first tapered portion 43 always becomes an obtuse angle regardless of the presence of the gap which occurs due to the unevenness between the thickness of the semiconductor chip 30 and that of the substrate 40, because the first tapered portion 43 is formed in the coupling hole 41 in addition to the second tapered portion 45. As a result, even if substrate 40 is thicker than that of the semiconductor chip 30, a portion above the first tapered portion 43 becomes a gentle surface as shown in FIG. 7(b) so that disconnection of wiring 90 can be prevented effectively.

In this embodiment, there are other methods for coupling the semiconductor chip 30 to the substrate 40 without using the substrate 20. One of them is to fill the adhesive member 50 in a gap between the taper surface of the semiconductor chip 30 and that of the substrate

Figure 8A:
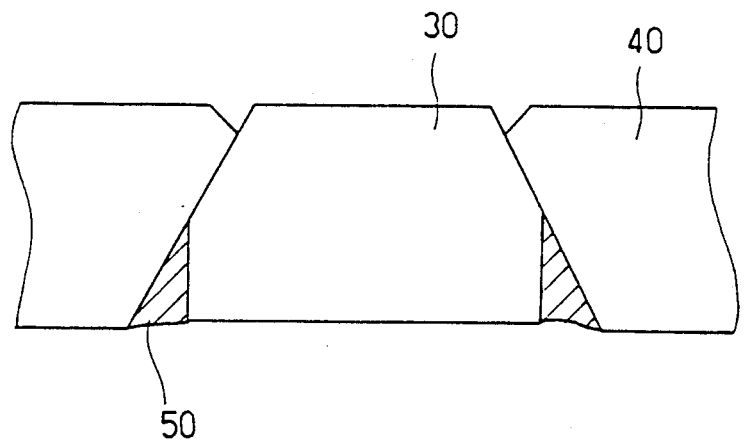
FIG. 8 is a sectional view of other example of the third embodiment.
Figure 8B:
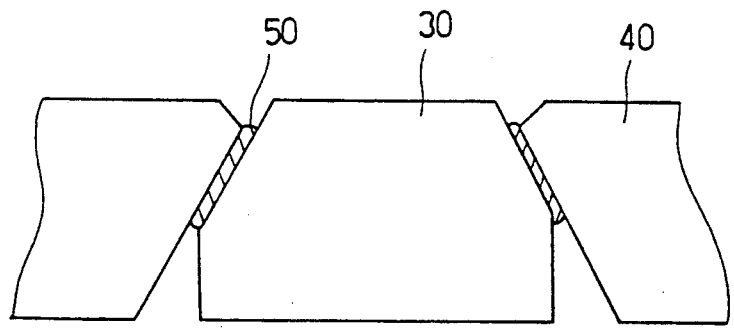

40 as shown in FIG. 8(a). The other is to couple the semiconductor chip 30 to the substrate by the adhesive member 50 as shown in FIG. 8(b). These methods reduce the production cost because the substrate 20 is unnecessary according to these methods.

Although the present invention is described in accordance with the first through third embodiments, it is not limited to the above described embodiments and the following modifications can be applied to the present invention.

(1) The substrate and the semiconductor chip are not limited to those using silicon having face-orientation (100). Silicon having another face-orientation or other semiconductor material can be applied to them.

(2) According to the above embodiments, the tapered portion of the semiconductor chip is provided on only the upper part thereof. However, the tapered portion can be formed on all sides of the chip so as to form a truncated pyramid.

(3) The angle of the tapered portion is not limited to 54.7°.

(4) Semiconductor elements can be formed on the underside of the semiconductor chip as well as the topside thereof.

(5) The present invention can be applied to a so-called wafer integration technique which provides circuit elements on all surfaces of the wafer. In that case, it would be unnecessary to provide lengthy wiring for a laser-cutting to a defect portion, because it would be possible to provide only a high quality chip which has no defect.

What is claimed is:

1. A semiconductor device comprising:
    a substrate made of silicon having a predetermined face-orientation on which a coupling hole having a tapered portion and a predetermined face orientation is formed by an anisotropic etching so that said coupling hole goes through the substrate from its main side surface to its opposite side surface and so that an opening size of the opposite side surface is larger than an opening size of the main side surface;
    a semiconductor chip made of silicon having the same face-orientation as said substrate, on which a taper portion having an equivalent face to said face orientation of said tapered portion of said coupling hole is formed by an anisotropic etching so that such equivalent face is exposed to said coupling hole extending from its main-side surface through the backside surface and so that its size of the main side surface is smaller than the opening size of the main surface of said coupling-hole, an element being formed on said semiconductor chip;
    a coupling member for coupling said semiconductor chip to said substrate so that said tapered portions of said substrate and said semiconductor chip correspond to each other;
    a leveling layer formed across said main side surface of said substrate and said main side surface of said semiconductor chip;
    a wiring electrically connected to said element, at least a part thereof being formed on said leveling layer, wherein the main side surface of said semiconductor chip protrudes upwardly from the main side surface of said substrate by an amount $2\Delta t$, where $\Delta t$ denotes unevenness of thickness of said substrate.

2. A semiconductor device comprising:
    a substrate made of silicon having a predetermined face-orientation on which a coupling hole having a tapered portion and a predetermined face orientation is formed by an anisotropic etching so that said coupling hole goes through the substrate from its main side surface to its opposite side surface and so that an opening size of the opposite side surface is larger than an opening size of the main side surface;
    a semiconductor chip made of silicon having the same face-orientation as said substrate, on which a taper portion having an equivalent face to said face orientation of said tapered portion of said coupling hole is formed by an anistropic etching so that such equivalent face is exposed to said coupling hole extending from its main-side surface through the backside surface and so that its size of the main side surface is smaller than the opening size of the main surface of said coupling-hole, an element being formed on said semiconductor chip;
    a coupling member for coupling said semiconductor chip to said substrate so that said tapered portions of said substrate and said semiconductor chip correspond to each other;
    a leveling layer formed across said substrate and said semiconductor chip;
    a wiring electrically connected to said element, at least a part thereof being formed on said leveling layer, wherein said coupling-hole has a first tapered portion which is formed on the main surface of said substrate so that the opening area of the main surface of said substrate is larger than an area of an inside portion of said substrate, and a second tapered portion which is formed on the opposite side of the main surface of said substrate so that the opening area of the opposite side is larger than the area of the inside portion of said substrate.

3. A semiconductor device as in claim 1, wherein said coupling-hole has a first tapered portion which is formed on the main surface of said substrate so that the opening area of the main surface of said substrate is larger than an area of an inside portion of said substrate, and a second tapered portion which is formed on the opposite side of the main surface of said substrate so that the opening area of the opposite side is larger than the area of the inside portion of said substrate.

* * * * *